United States Patent
Arfaei Malekzadeh et al.

(10) Patent No.: US 11,165,397 B2
(45) Date of Patent: Nov. 2, 2021

(54) APPARATUS AND METHODS FOR TRUE POWER DETECTION

(71) Applicant: Skyworks Solutions, Inc., Irvine, CA (US)

(72) Inventors: Foad Arfaei Malekzadeh, Ottawa (CA); Abdulhadi Ebrahim Abdulhadi, Ottawa (CA); Sanjeev Jain, Ottawa (CA)

(73) Assignee: Skyworks Solutions, Inc., Irvine, CA (US)

( * ) Notice: Subject to any disclaimer, the term of this patent is extended or adjusted under 35 U.S.C. 154(b) by 7 days.

(21) Appl. No.: 16/749,758

(22) Filed: Jan. 22, 2020

(65) Prior Publication Data

US 2020/0266777 A1    Aug. 20, 2020

Related U.S. Application Data

(60) Provisional application No. 62/798,779, filed on Jan. 30, 2019.

(51) Int. Cl.
| | |
|---|---|
| *H03G 3/30* | (2006.01) |
| *H03F 3/24* | (2006.01) |
| *H03F 3/193* | (2006.01) |
| *H03F 1/56* | (2006.01) |

(52) U.S. Cl.
CPC .............. *H03F 3/245* (2013.01); *H03F 1/56* (2013.01); *H03F 3/193* (2013.01)

(58) Field of Classification Search
CPC ........................................................ H03G 3/30
USPC .................................................. 330/278, 279
See application file for complete search history.

(56) References Cited

U.S. PATENT DOCUMENTS

| | | | |
|---|---|---|---|
| 6,397,077 B1 | 5/2002 | Jensen | |
| 6,759,922 B2 | 7/2004 | Adar et al. | |
| 6,894,476 B2 | 5/2005 | Wyse et al. | |
| 8,183,917 B2 * | 5/2012 | Drogi | H03F 3/195 330/129 |
| 8,330,552 B2 | 12/2012 | Li et al. | |
| 8,795,267 B2 * | 8/2014 | Hancock | A61B 18/18 606/33 |
| 8,928,428 B2 | 1/2015 | Gorbachov | |
| 9,014,647 B2 | 4/2015 | Kitching et al. | |
| 9,093,734 B2 | 7/2015 | Gorbachov | |
| 9,166,537 B2 * | 10/2015 | Schmidt | H03F 3/195 |
| 9,214,967 B2 | 12/2015 | Reisner et al. | |
| 9,356,330 B1 | 5/2016 | Donoghue et al. | |
| 9,496,902 B2 | 11/2016 | Srirattana et al. | |
| 9,553,617 B2 | 1/2017 | Srirattana et al. | |
| 9,614,269 B2 | 4/2017 | Srirattana et al. | |
| 9,692,103 B2 | 6/2017 | Srirattana et al. | |
| 9,748,627 B2 | 8/2017 | Sun et al. | |

(Continued)

*Primary Examiner* — Henry Choe
(74) *Attorney, Agent, or Firm* — Knobbe, Martens, Olson & Bear, LLP

(57) ABSTRACT

Apparatus and methods for true power detection are provided herein. In certain embodiments, a power amplifier system includes an antenna, a directional coupler, and a power amplifier electrically connected to the antenna by way of a through line of the directional coupler. The power amplifier system further includes a combiner that combines a first coupled signal from a first end of the directional coupler's coupled line with a second coupled signal from a second end of the directional coupler's coupled line.

20 Claims, 12 Drawing Sheets

(56) References Cited

U.S. PATENT DOCUMENTS

| | | |
|---|---|---|
| 9,755,670 B2 | 9/2017 | Chen et al. |
| 9,762,416 B2 * | 9/2017 | Mandegaran .......... H01Q 1/243 |
| 9,793,592 B2 | 10/2017 | Srirattana et al. |
| 9,812,757 B2 | 11/2017 | Srirattana et al. |
| 9,866,244 B2 | 1/2018 | Srirattana et al. |
| 9,866,335 B2 | 1/2018 | Hernandez |
| 9,905,902 B2 | 2/2018 | Zhang et al. |
| 9,941,856 B2 | 4/2018 | Srirattana et al. |
| 9,948,271 B2 | 4/2018 | Srirattana et al. |
| 9,953,938 B2 | 4/2018 | Srirattana et al. |
| 9,954,562 B2 | 4/2018 | Reisner et al. |
| 9,954,564 B2 | 4/2018 | Little et al. |
| 9,960,747 B2 | 5/2018 | Whitefield et al. |
| 9,960,750 B2 | 5/2018 | Srirattana et al. |
| 10,051,578 B2 * | 8/2018 | Langer .................. G01R 21/00 |
| 10,084,224 B2 | 9/2018 | Srirattana et al. |
| 10,128,558 B2 | 11/2018 | Sun et al. |
| 10,141,901 B2 * | 11/2018 | Zhang .................. H03F 1/0227 |
| 10,147,994 B2 | 12/2018 | Jayaraman et al. |
| 2012/0019335 A1 | 1/2012 | Hoang et al. |
| 2015/0077187 A1 * | 3/2015 | Lam ...................... H03F 1/0266 |
| | | 330/296 |
| 2015/0349742 A1 | 12/2015 | Chen et al. |
| 2017/0093441 A1 * | 3/2017 | Mandegaran .......... H04B 1/005 |
| 2017/0094607 A1 | 3/2017 | Ripley |
| 2017/0317396 A1 | 11/2017 | Srirattana et al. |
| 2017/0324392 A1 | 11/2017 | Srirattana et al. |
| 2017/0373368 A1 | 12/2017 | Srirattana et al. |
| 2018/0191050 A1 | 7/2018 | Zhang et al. |
| 2018/0351530 A1 | 12/2018 | Srirattana et al. |
| 2019/0131684 A1 | 5/2019 | Jayaraman et al. |
| 2019/0190112 A1 | 6/2019 | Srirattana et al. |
| 2019/0215774 A1 | 7/2019 | Ripley |
| 2019/0229700 A1 | 7/2019 | Srirattana et al. |
| 2019/0312328 A1 | 10/2019 | Zhang et al. |
| 2019/0334562 A1 | 10/2019 | Cook et al. |
| 2019/0379099 A1 | 12/2019 | Srirattana et al. |
| 2020/0119741 A1 | 4/2020 | Jain et al. |
| 2020/0119742 A1 | 4/2020 | Jain et al. |
| 2020/0169285 A1 | 5/2020 | Arfaei Malekzadeh et al. |
| 2020/0266777 A1 | 8/2020 | Arfaei Malekzadeh et al. |
| 2020/0335844 A1 | 10/2020 | Jayaraman et al. |

* cited by examiner

SWR=2, ACROSS PHASE

SWR=3, ACROSS PHASE

APPARATUS AND METHODS FOR TRUE POWER DETECTION

CROSS-REFERENCE TO RELATED APPLICATIONS

This application claims the benefit of priority under 35 U.S.C. § 119 of U.S. Provisional Patent Application No. 62/798,779, filed Jan. 30, 2019 and titled "APPARATUS AND METHODS FOR TRUE POWER DETECTION," which is herein incorporated by reference in its entirety.

BACKGROUND

Technical Field

Embodiments of the invention relate to electronic systems, and in particular, to radio frequency (RF) electronics.

Description of Related Technology

A communication system can include a transceiver, a front end, and one or more antennas for wirelessly transmitting and/or receiving signals. The front end can include low noise amplifier(s) for amplifying relatively weak signals received via the antenna(s), and power amplifier(s) for boosting signals for transmission via the antenna(s).

Examples of communication systems include, but are not limited to, mobile phones, tablets, base stations, network access points, customer-premises equipment (CPE), laptops, and wearable electronics.

SUMMARY

In certain embodiments, the present disclosure relates to a power amplifier system. The power amplifier system includes a power amplifier configured to receive a radio frequency signal at an input and to output an amplified radio frequency signal at an output, an antenna configured to transmit the amplified radio frequency signal, a directional coupler having a through line and a coupled line, the through line electrically connected between the output of the power amplifier and the antenna, and a combiner configured to generated a combined signal based on combining a first coupled signal from a first end of the coupled line and a second coupled signal from a second end of the coupled line.

In some embodiments, the power amplifier system further includes a power detector configured to generate a power detection signal based on detecting a power of the combined signal. According to a number of embodiments, the power amplifier system further includes an analog-to-digital converter configured to digitize the power detection signal. In accordance with several embodiments, the power detector is a root mean square power detector.

In various embodiments, the combiner is a quadrature hybrid. According to some embodiments, the power amplifier system further includes a termination impedance, and the quadrature hybrid includes a first terminal electrically connected to the first end of the coupled line, a second terminal electrically connected to the second end of the coupled line, a third terminal configured to output the combined signal, and a fourth terminal electrically connected to the termination impedance.

In several embodiments, the directional coupler has a coupling factor of at least 16 dB.

In some embodiments, the directional coupler has a directivity of at least 10 dB.

In various embodiments, the directional coupler is implemented as a slow wave coupler.

In a number of embodiments, the through line is substantially U-shaped and the coupled line is substantially U-shaped. According to some embodiments, the directional coupler further includes a plurality of coupling conductors extending beneath the through line and the coupled line.

In several embodiments, the power amplifier system further includes a switch including an input electrically connected to the first end of the coupled line, a first output configured to provide the first coupled signal to the combiner in a first state of the switch, and a second output configured to output a forward power signal in a second state of the switch.

In some embodiments, the amplified radio frequency signal is a millimeter wave signal.

In certain embodiments, the present disclosure relates to a method of power detection in a radio frequency communication system. The method includes amplifying a radio frequency signal to generate an amplified radio frequency signal using a power amplifier, providing the amplified radio frequency signal from an output of the power amplifier to an antenna by way of a through line of a directional coupler, and generating a combined signal based on combining a first coupled signal from a first end of a coupled line of the directional coupler and a second coupled signal from a second end of the coupled line of the directional coupler.

In a number of embodiments, the method further includes generating a power detection signal based on detecting a power of the combined signal. According to several embodiments, the method further includes digitizing the power detection signal using an analog-to-digital converter. In accordance with various embodiments, the method further includes controlling a transmit power of the radio frequency communication system based on the digitized power detection signal. According to some embodiments, controlling the transmit power includes tuning an output matching network of the power amplifier based on the digitized power detection signal. In accordance with several embodiments, controlling the transmit power includes adjusting a bias of the power amplifier based on the digitized power detection signal. According to various embodiments, controlling the transmit power includes tuning the antenna based on the digitized power detection signal.

In some embodiments, the power detector is a root mean square power detector.

In various embodiments, the combiner is a quadrature hybrid. According to several embodiments, the quadrature hybrid includes a first terminal electrically connected to the first end of the coupled line, a second terminal electrically connected to the second end of the coupled line, a third terminal configured to output the combined signal, and a fourth terminal electrically connected to a termination impedance.

In a number of embodiments, the directional coupler has a coupling factor of at least 16 dB.

In various embodiments, the directional coupler has a directivity of at least 10 dB.

In some embodiments, the directional coupler is implemented as a slow wave coupler.

In several embodiments, the through line is substantially U-shaped and the coupled line is substantially U-shaped.

In a number of embodiments, the method further includes outputting the first coupled signal to the combiner from a first switch output in a first state of a switch, and outputting the first coupled signal at a second switch output in a second state of the switch.

In some embodiments, the amplified radio frequency signal is a millimeter wave signal.

In certain embodiments, the present disclosure relates to a packaged module. The packaged module includes a package substrate and at least one semiconductor die attached to the package substrate. The at least one semiconductor die includes a directional coupler having a through line and a coupled line, a combiner configured to generated a combined signal based on combining a first coupled signal from a first end of the coupled line and a second coupled signal from a second end of the coupled line, and a power detector configured to generate a power detection signal based on detecting a power of the combined signal.

In various embodiments, the packaged module further includes a power amplifier configured to provide an amplified radio frequency signal to the through line. In a number of embodiments, the power amplifier and the directional coupler are on a common semiconductor die of the at least one semiconductor die. In several embodiments, the power amplifier and the directional coupler are on different semiconductor dies of the at least one semiconductor die. According to various embodiments, the packaged module further includes an antenna, the through line electrically connected between an output of the power amplifier and the antenna.

In a number of embodiments, the at least one semiconductor die further includes an analog-to-digital converter configured to digitize the power detection signal.

In several embodiments, the power detector is a root mean square power detector.

In various embodiments, the combiner is a quadrature hybrid.

In some embodiments, the directional coupler has a coupling factor of at least 16 dB.

In a number of embodiments, the directional coupler has a directivity of at least 10 dB.

In various embodiments, the directional coupler is implemented as a slow wave coupler.

In some embodiments, the through line is substantially U-shaped and the coupled line is substantially U-shaped. According to various embodiments, the directional coupler further includes a plurality of coupling conductors extending beneath the through line and the coupled line.

In several embodiments, the at least one semiconductor die further includes a switch including an input electrically connected to the first end of the coupled line, a first output configured to provide the first coupled signal to the combiner in a first state of the switch, and a second output configured to output a forward power signal in a second state of the switch.

In a number of embodiments, the amplified radio frequency signal is a millimeter wave signal.

In certain embodiments, the present disclosure relates to a mobile device. The mobile device includes a transceiver configured to output a radio frequency signal, an antenna, and a front end system configured to process the radio frequency signal to generate an amplified radio frequency signal for transmission on the antenna. The front end system includes a power amplifier configured amplify the radio frequency signal and a directional coupler having a through line and a coupled line, the through line electrically connected between an output of the power amplifier and the antenna, the front end system further including a combiner configured to generated a combined signal based on combining a first coupled signal from a first end of the coupled line and a second coupled signal from a second end of the coupled line.

In a number of embodiments, the front end system further includes a power detector configured to generate a power detection signal based on detecting a power of the combined signal. According to several embodiments, the front end system further includes an analog-to-digital converter configured to digitize the power detection signal. In accordance with some embodiments, the mobile device further includes a baseband processor configured to process the digitized power detection signal to control a transmit power of the mobile device. According to several embodiments, the baseband processor is configured to tune an output matching network of the power amplifier based on the digitized power detection signal. In accordance with some embodiments, the baseband processor is configured to adjust a bias of the power amplifier based on the digitized power detection signal. According to various embodiments, the baseband processor is configured to tune the antenna based on the digitized power detection signal.

In some embodiments, the power detector is a root mean square power detector.

In various embodiments, the combiner is a quadrature hybrid. According to a number of embodiments, the front end system further includes a termination impedance, and the quadrature hybrid includes a first terminal electrically connected to the first end of the coupled line, a second terminal electrically connected to the second end of the coupled line, a third terminal configured to output the combined signal, and a fourth terminal electrically connected to the termination impedance.

In several embodiments, the directional coupler has a coupling factor of at least 16 dB.

In a number of embodiments, the directional coupler has a directivity of at least 10 dB.

In various embodiments, the directional coupler is implemented as a slow wave coupler.

In some embodiments, the through line is substantially U-shaped and the coupled line is substantially U-shaped. According to several embodiments, the directional coupler further includes a plurality of coupling conductors extending beneath the through line and the coupled line.

In a number of embodiments, the front end system further includes a switch includes an input electrically connected to the first end of the coupled line, a first output configured to provide the first coupled signal to the combiner in a first state of the switch, and a second output configured to output a forward power signal in a second state of the switch.

In various embodiments, the amplified radio frequency signal is a millimeter wave signal.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
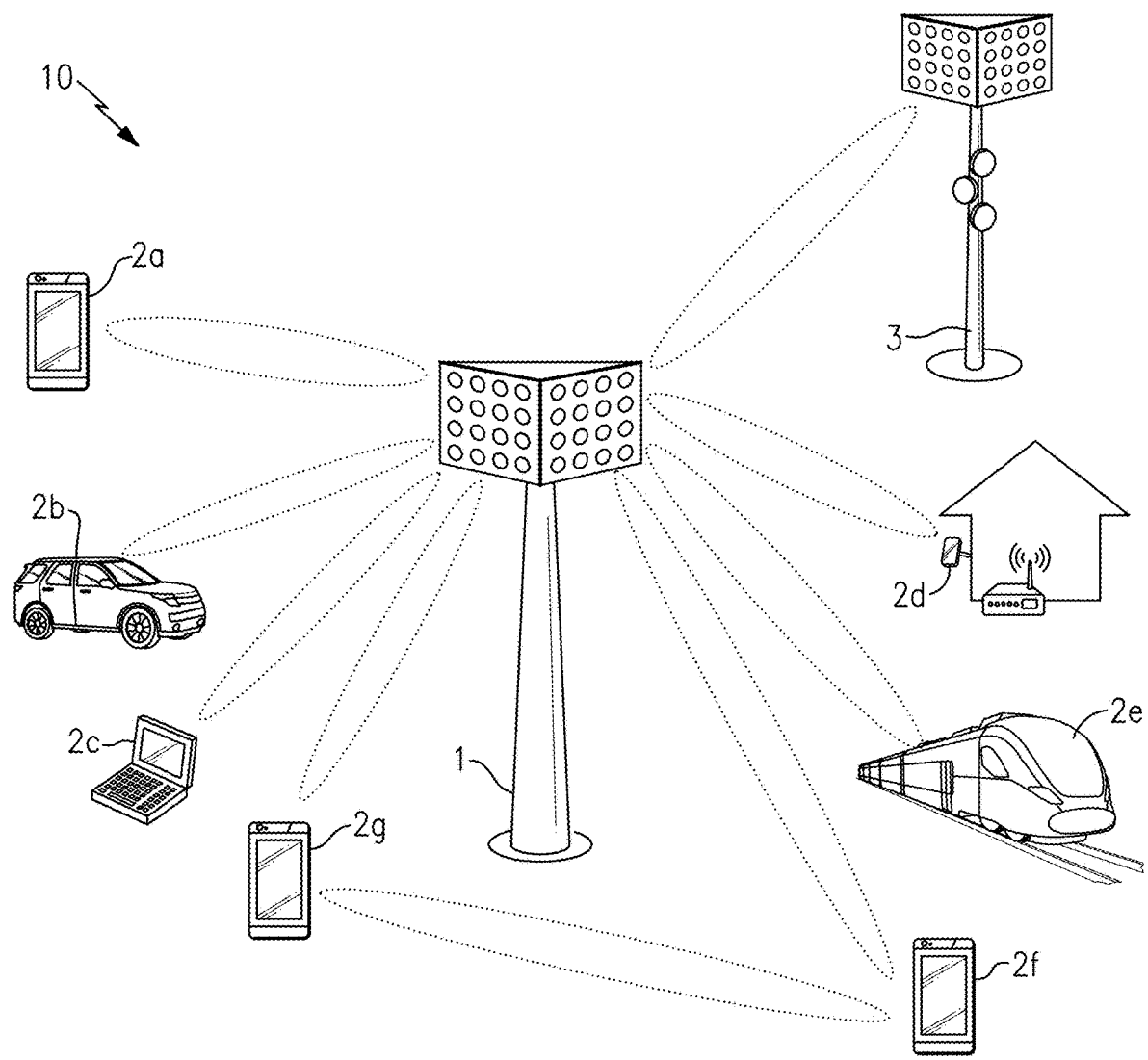
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and plans to introduce Phase 2 of 5G technology in Release 16 (targeted for 2019). Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
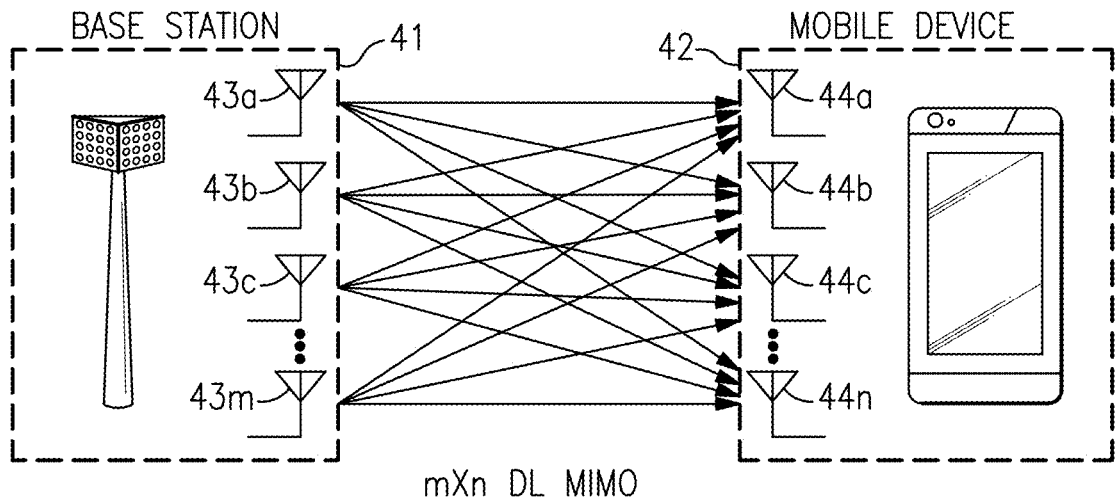
FIG. 2A is a schematic diagram of one example of a downlink channel using multi-input and multi-output (MIMO) communications.
Figure 2B:
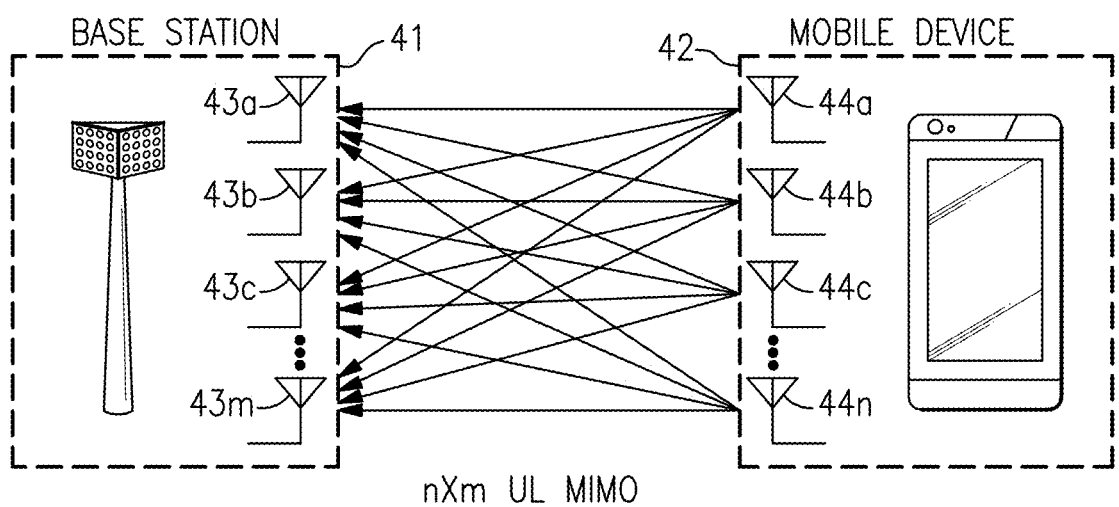
FIG. 2B is schematic diagram of one example of an uplink channel using MIMO communications.

FIG. 2A is a schematic diagram of one example of a downlink channel using multi-input and multi-output (MIMO) communications. FIG. 2B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 2A, downlink MIMO communications are provided by transmitting using M antennas 43a, 43b, 43c, . . . 43m of the base station 41 and receiving using N antennas 44a, 44b, 44c, . . . 44n of the mobile device 42. Accordingly, FIG. 2A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 2B, uplink MIMO communications are provided by transmitting using N antennas 44a, 44b, 44c, . . . 44n of the mobile device 42 and receiving using M antennas 43a, 43b, 43c, . . . 43m of the base station 41. Accordingly, FIG. 2B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 2C:
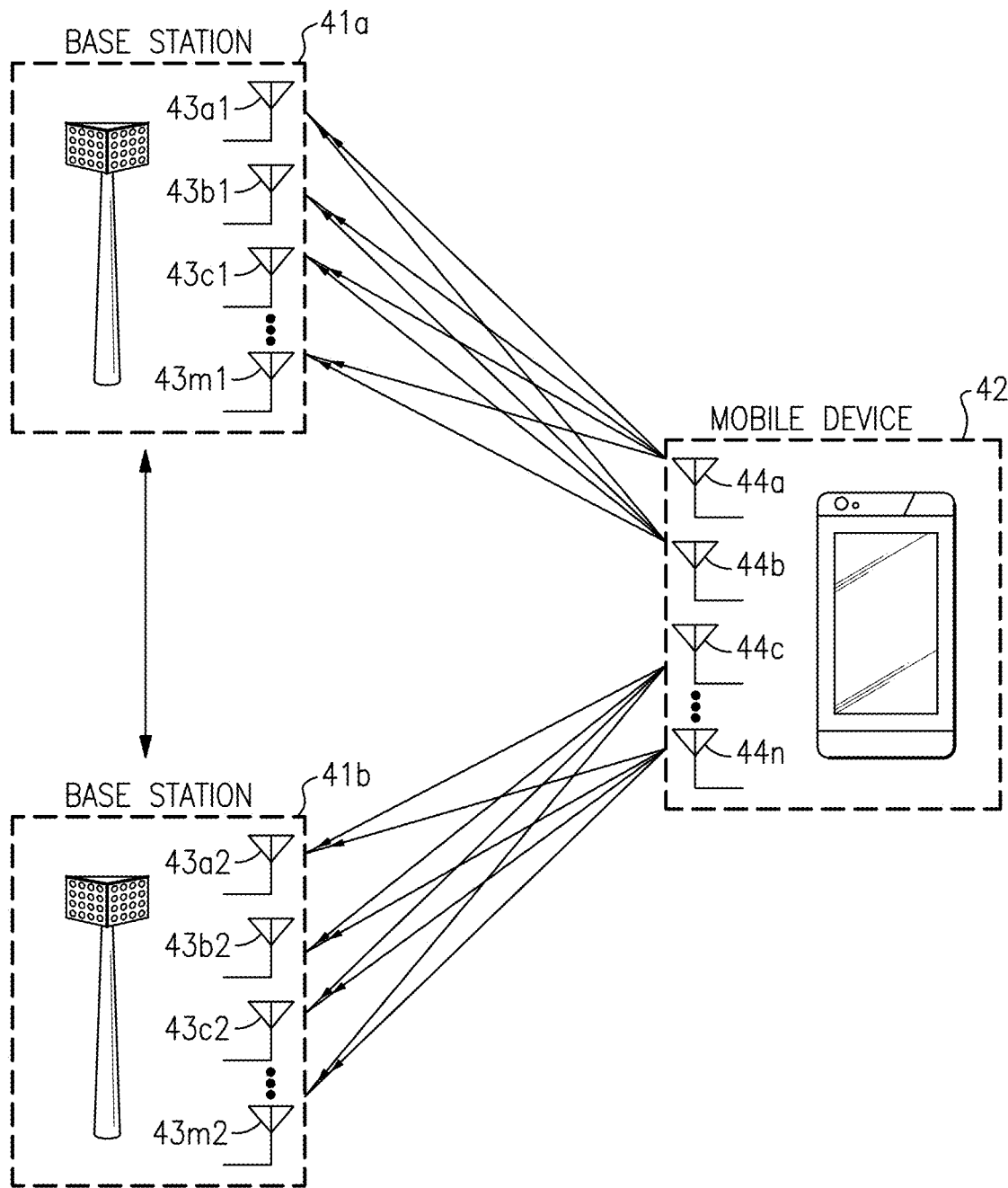
FIG. 2C is schematic diagram of another example of an uplink channel using MIMO communications.

FIG. 2C is schematic diagram of another example of an uplink channel using MIMO communications. In the example shown in FIG. 2C, uplink MIMO communications are provided by transmitting using N antennas 44a, 44b, 44c, . . . 44n of the mobile device 42. Additional a first portion of the uplink transmissions are received using M antennas 43a1, 43b1, 43c1, . . . 43m1 of a first base station 41a, while a second portion of the uplink transmissions are received using M antennas 43a2, 43b2, 43c2, . . . 43m2 of a second base station 41b. Additionally, the first base station 41a and the second base station 41b communication with one another over wired, optical, and/or wireless links.

The MIMO scenario of FIG. 2C illustrates an example in which multiple base stations cooperate to facilitate MIMO communications.

Figure 3A:
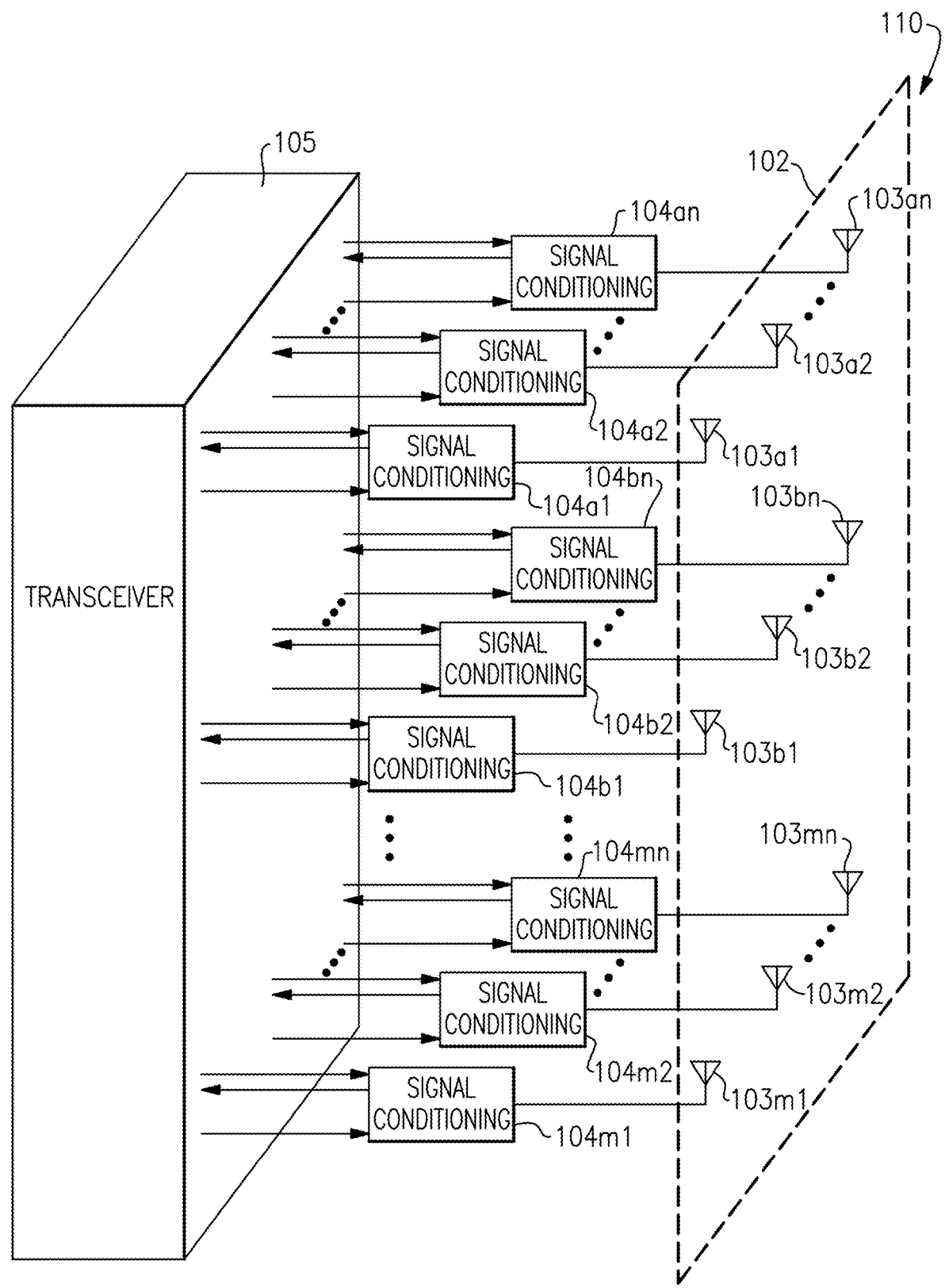
FIG. 3A is a schematic diagram of one example of a communication system that operates with beamforming.

FIG. 3A is a schematic diagram of one example of a communication system 110 that operates with beamforming. The communication system 110 includes a transceiver 105, signal conditioning circuits 104a1, 104a2 . . . 104an, 104b1, 104b2 . . . 104bn, 104m1, 104m2 . . . 104mn, and an antenna array 102 that includes antenna elements 103a1, 103a2 . . . 103an, 103b1, 103b2 . . . 103bn, 103m1, 103m2 . . . 103mn.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 3A, the transceiver 105 generates control signals for the signal conditioning circuits. The control signals can be used for a variety of functions, such as controlling the gain and phase of transmitted and/or received signals to control beamforming.

Figure 3B:
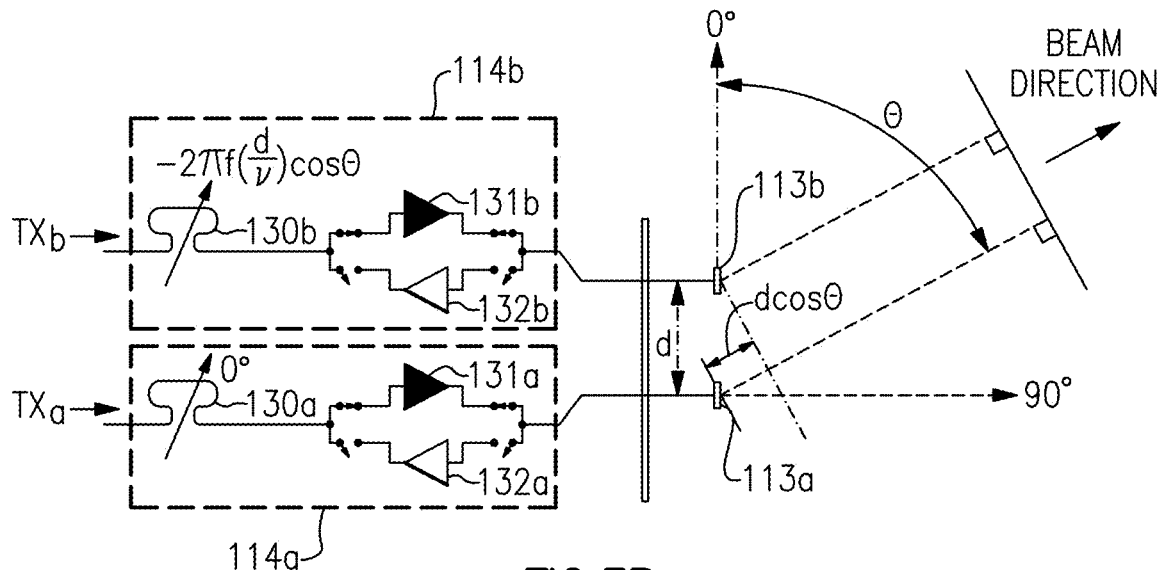
FIG. 3B is a schematic diagram of one example of beamforming to provide a transmit beam.

FIG. 3B is a schematic diagram of one example of beamforming to provide a transmit beam. FIG. 3B illustrates a portion of a communication system including a first signal conditioning circuit 114a, a second signal conditioning circuit 114b, a first antenna element 113a, and a second antenna element 113b.

Although illustrated as included two antenna elements and two signal conditioning circuits, a communication system can include additional antenna elements and/or signal conditioning circuits. For example, FIG. 3B illustrates one embodiment of a portion of the communication system 110 of FIG. 3A.

The first signal conditioning circuit 114a includes a first phase shifter 130a, a first power amplifier 131a, a first low noise amplifier (LNA) 132a, and switches for controlling selection of the power amplifier 131a or LNA 132a. Additionally, the second signal conditioning circuit 114b includes a second phase shifter 130b, a second power amplifier 131b, a second LNA 132b, and switches for controlling selection of the power amplifier 131b or LNA 132b.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113a and the second antenna element 113b are separated by a distance d. Additionally, FIG. 3B has been annotated with an angle $\Theta$, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113a, 113b, a desired transmit beam angle $\Theta$ can be achieved. For example, when the first phase shifter 130a has a reference value of 0°, the second phase shifter 130b can be controlled to provide a phase shift of about $-2\pi f(d/v)\cos\Theta$ radians, where f is the fundamental frequency of the transmit signal, d is the distance between the antenna elements, v is the velocity of the radiated wave, and $\pi$ is the mathematic constant pi.

In certain implementations, the distance d is implemented to be about ½λ, where λ is the wavelength of the fundamental component of the transmit signal. In such implementations, the second phase shifter 130b can be controlled to provide a phase shift of about $-\pi\cos\Theta$ radians to achieve a transmit beam angle $\Theta$.

Accordingly, the relative phase of the phase shifters 130a, 130b can be controlled to provide transmit beamforming. In certain implementations, a baseband processor and/or a transceiver (for example, the transceiver 105 of FIG. 3A)

controls phase values of one or more phase shifters and gain values of one or more controllable amplifiers to control beamforming.

Figure 3C:
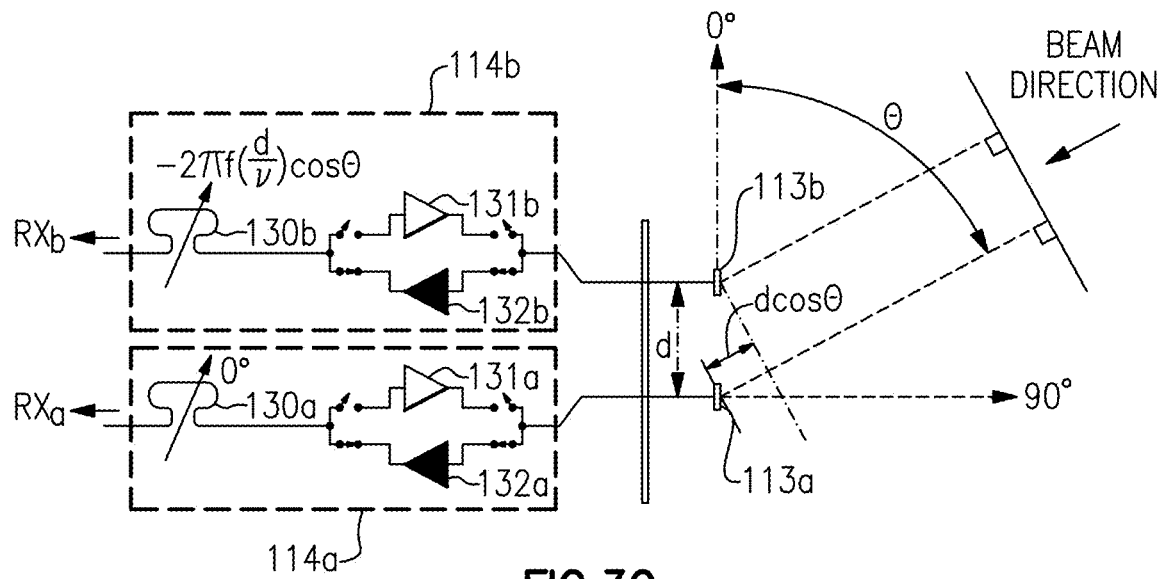
FIG. 3C is a schematic diagram of one example of beamforming to provide a receive beam.

FIG. 3C is a schematic diagram of one example of beamforming to provide a receive beam. FIG. 3C is similar to FIG. 3B, except that FIG. 3C illustrates beamforming in the context of a receive beam rather than a transmit beam.

As shown in FIG. 3C, a relative phase difference between the first phase shifter 130a and the second phase shifter 130b can be selected to about equal to $-2\pi f(d/v)\cos \Theta$ radians to achieve a desired receive beam angle $\Theta$. In implementations in which the distance d corresponds to about $\frac{1}{2}\lambda$, the phase difference can be selected to about equal to $-\pi \cos \Theta$ radians to achieve a receive beam angle $\Theta$.

Although various equations for phase values to provide beamforming have been provided, other phase selection values are possible, such as phase values selected based on implementation of an antenna array, implementation of signal conditioning circuits, and/or a radio environment.

Examples of Radio Frequency Systems with True Power Detection

In certain applications, such as wideband and/or high frequency communications, it is important to know an amount of true power delivered to an antenna. For example, information indicating an amount of actual power can be processed to provide enhanced control over transmit power, linearity, and/or other transmission characteristics.

A power measurement can be used to enhance a performance of an RF system. Examples of mechanisms for controlling power delivered to an antenna include, but are not limited to, tuning of a power amplifier's output matching network, adjusting a power amplifier's bias, and/or tuning of an antenna (for instance, aperture tuning).

When a standing wave ratio (SWR) of a load is not matched, the power detected at the output of a power amplifier drops. Additionally, a total radiated power (TRP), effective isotropic radiated power (EIRP), and/or system efficiency is reduced.

It is desirable to detect the true power delivered from the power amplifier to a load, such that one or more adjustment mechanisms can be used to deliver a desired amount of power to an antenna.

Conventional power detectors fail to measure true power delivered to a load/antenna over a wide range of SWR conditions, particularly for millimeter wave frequencies.

For example, a forward or incident power and a reverse or reflected power can be measured using a directional coupler and a pair of power detectors. Although such a power measurement technique can be used to detect a standing wave ratio, true power delivered depends on the complex impedance of the load, and thus also on load phase. Although a worst case phase can be used as a conservative estimate for actual power delivered, assuming the worst case phase can lead to inefficiencies and/or an overdesigned system.

Apparatus and methods for true power detection are provided herein. In certain embodiments, a power amplifier system includes an antenna, a directional coupler, and a power amplifier electrically connected to the antenna by way of a through line of the directional coupler. The power amplifier system further includes a combiner that combines a first coupled signal from a first end of the directional coupler's coupled line with a second coupled signal from a second end of the directional coupler's coupled line.

The first coupled signal and the second coupled signal include information indicating a load phase, and thus the output of the combiner can be processed to generate a detection signal indicating true power. In certain implementations, the power amplifier system includes a power detector (for instance, a root mean square or RMS power detector) that generates a true power detection signal based on detecting an amount of power at the output of the combiner. In certain implementations, the combiner is implemented as a quadrature combiner, such as a quadrature hybrid (for instance, a branch line or lumped element equivalent combiner).

The directional coupler includes a through line and a coupled line, which are electromagnetically coupled to one another. In certain implementations the through line and the coupled line are coupled with a coupling factor of at least 16 dB. For example, the directional coupler can be implemented as a slow wave coupler.

True power detection systems can be used in a wide variety of applications. For example, true power detection systems can be used for true power detection of radio frequency (RF) signals transmitted by base stations, network access points, mobile phones, tablets, laptops, computers, and/or other communications devices. Furthermore, communications devices that utilize millimeter wave carriers (for instance, 30 GHz to 300 GHz), centimeter wave carriers (for instance, 3 GHz to 30 GHz), and/or other carrier frequencies can employ a true power detection system for detecting the true power delivered to an antenna.

Figure 4A:
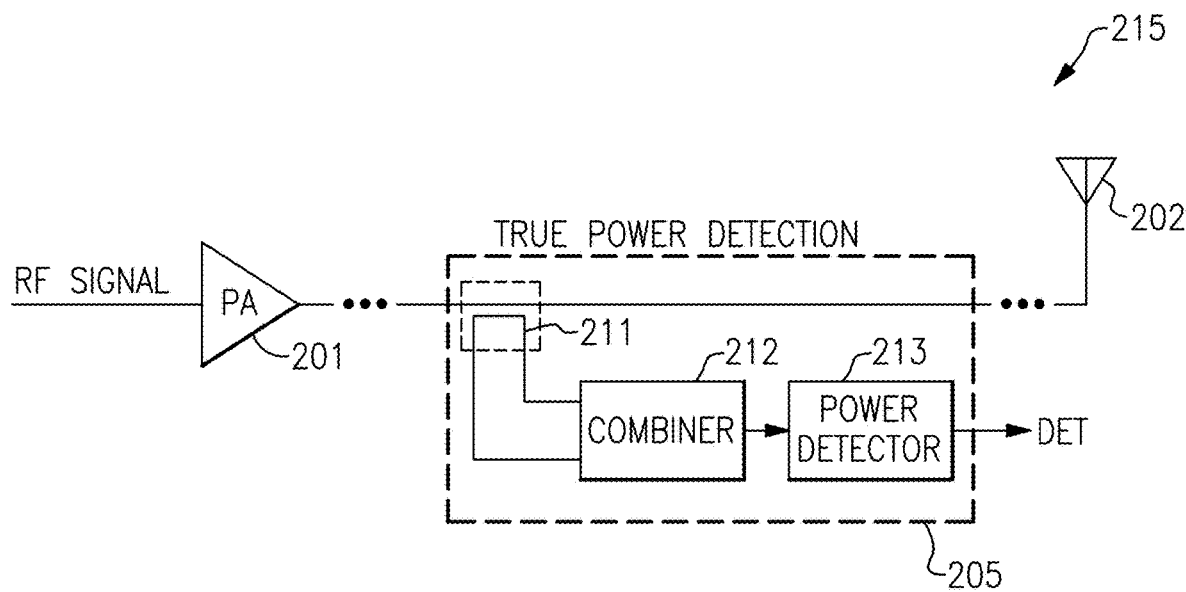
FIG. 4A is a schematic diagram of a power amplifier system according to one embodiment.

FIG. 4A is a schematic diagram of a power amplifier system 215 according to one embodiment. The power amplifier system 215 includes a power amplifier 201, an antenna 202, and a true power detection system 205. The true power detection system 205 includes a directional coupler 211, a combiner 212, and a power detector 213.

The true power detection system 205 serves to generate a true power detection signal (DET) indicating a true or actual power delivered to the antenna 202 by the power amplifier 201.

Although conventional power measurement techniques can be used to detect a standing wave ratio, true power delivered depends on the load complex impedance, and thus also on load phase. Although a worst case phase can be used as a conservative estimate for actual power delivered, assuming the worst case phase can lead to inefficiencies and/or an overdesigned system.

In contrast, the true power detection signal changes in relation to load phase of the antenna 202. Accordingly, an actual amount of power delivered to the antenna 202 can be detected.

In the illustrated embodiment, the true power detection system 205 includes a directional coupler 211, a combiner 212, and a power detector 213 that outputs the true power detection signal. The directional coupler 211 includes a through line that is positioned along an RF signal path from an output of the power amplifier 201 to the antenna 202. As indicated by the ellipses, one or more components can be included between the power amplifier's output and the through line and/or between the through line and the antenna 202.

The combiner 212 operates to combine a first coupled signal from one end of the directional coupler's coupled line with a second coupled signal from another end of the directional coupler's coupled line. The power detector 213 generates the true power detection signal based on detecting an amount of power of the combined signal generated by the combiner 212.

Figure 4B:
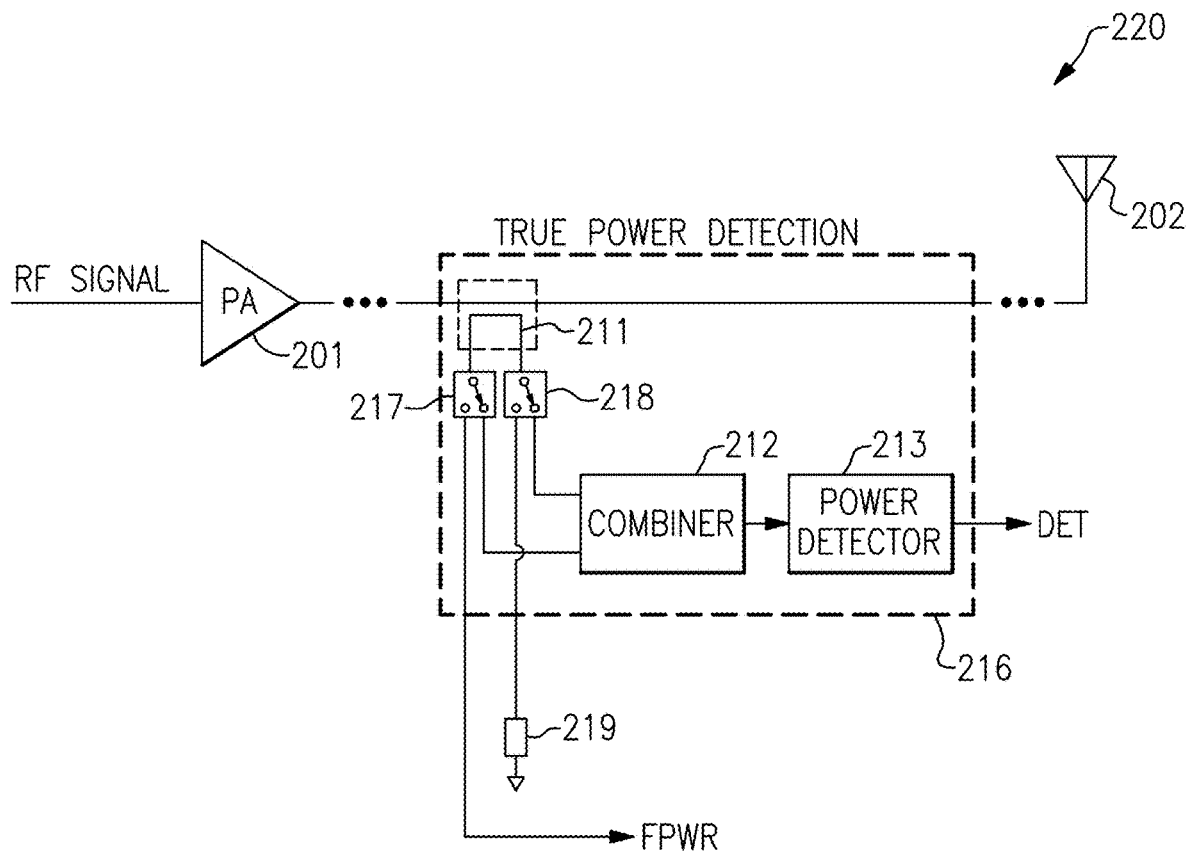
FIG. 4B is a schematic diagram of a power amplifier system according to another embodiment.

FIG. 4B is a schematic diagram of a power amplifier system 220 according to another embodiment. The power amplifier system 220 of FIG. 4B includes a power amplifier 201, an antenna 202, a true power detection system 216, and a termination impedance 219.

The true power detection system 216 of FIG. 4B is similar to the true power detection system 205 of FIG. 4A, except that the true power detection system 216 of FIG. 4B further includes a first switch 217 and a second switch 218. The state of the first switch 217 and the second switch 218 can be controlled in a wide variety of ways, such as by a control signal from a radio frequency integrated circuit (RF IC), baseband processor, and/or other suitable circuitry.

As shown in FIG. 4B, the first switch 217 and the second switch 218 can be set in a first state in which the coupled line of the directional coupler 211 is actively connected to the combiner 212 such that the true power detection signal (DET) is generated. The first switch 217 and the second switch 218 can also be set in a second state in which one end of the coupled line of the directional coupler 217 is actively connected to the termination impedance 219 (for instance, a resistor of about 50 Ohms) and the other end of the coupled line of the directional coupler 217 generates a forward power detection signal (FPWR).

Implementing the true power detection system 216 with switches enhances flexibility by allowing the directional coupler 211 to be used for both true power detection and for forward power detection.

Figure 5:
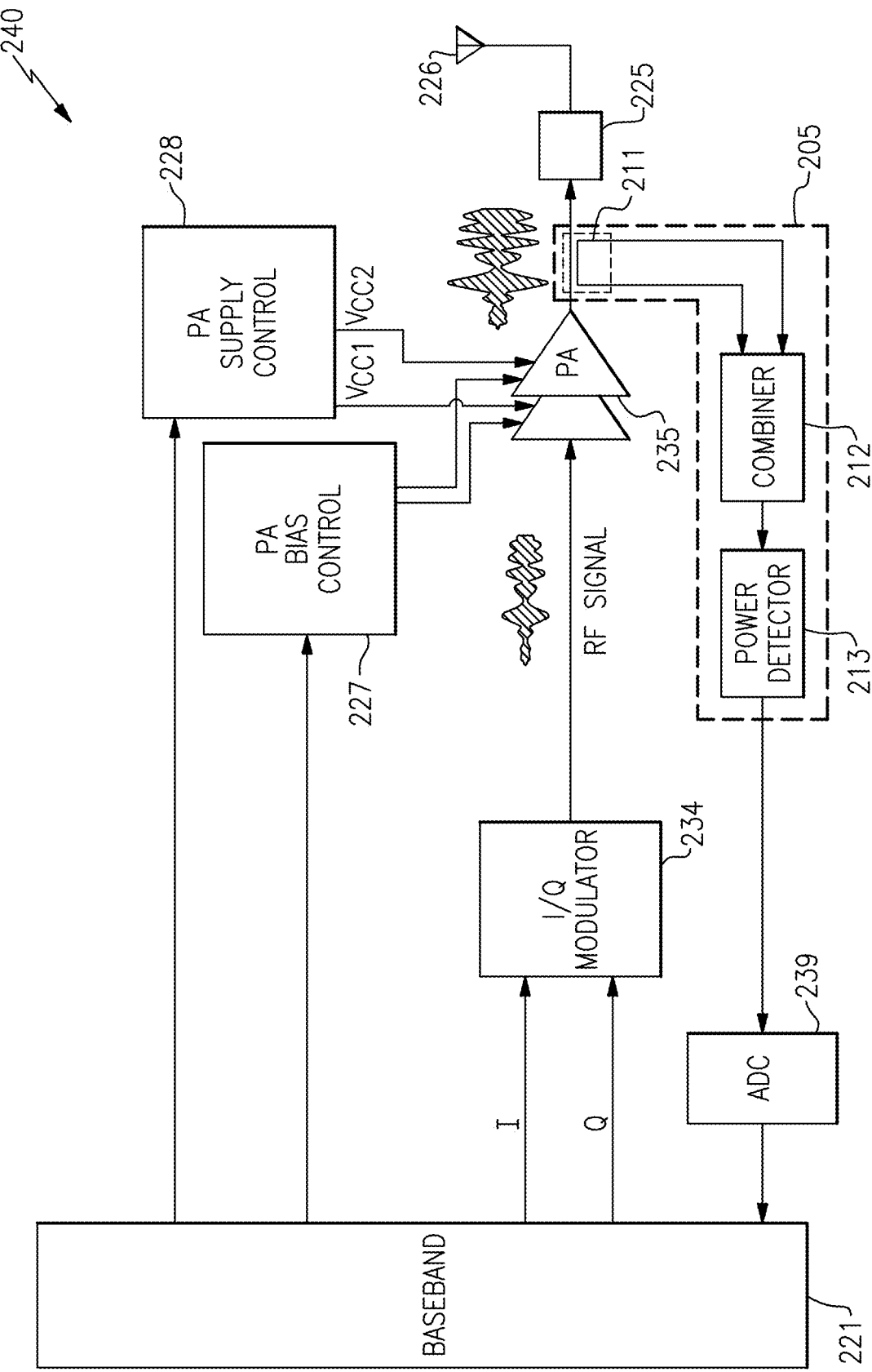
FIG. 5 is a schematic diagram of a power amplifier system according to another embodiment.

FIG. 5 is a schematic diagram of a power amplifier system 240 according to another embodiment. The illustrated power amplifier system 240 includes a baseband processor 221, an I/Q modulator 234, a power amplifier (PA) 235, front-end antenna access circuitry 225, an antenna 226, a PA bias control circuit 227, a PA supply control circuit 228, an analog-to-digital converter (ADC) 239, and a true power detection system 205.

Although the power amplifier system 240 of FIG. 5 is depicted as including the true power detection system 205 of FIG. 4A, the power amplifier system 240 can be implemented with any of the true power detection systems disclosed herein.

The baseband processor 221 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 234 in a digital format. The baseband processor 221 can be any suitable processor configured to process a baseband signal. For instance, the baseband processor 221 can include a digital signal processor, a microprocessor, a programmable core, or any combination thereof. Moreover, in some implementations, two or more baseband processors 221 can be included in the power amplifier system 240.

The I/Q modulator 234 can be configured to receive the I and Q signals from the baseband processor 221 and to process the I and Q signals to generate an RF signal. For example, the I/Q modulator 234 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 235. In certain implementations, the I/Q modulator 234 can include one or more filters configured to filter frequency content of signals processed therein.

The power amplifier 235 can receive the RF signal from the I/Q modulator 234, and when enabled can provide an amplified RF signal to the antenna 226 via the front-end antenna access circuitry 225.

The front-end antenna access circuitry 225 can be implemented in a wide variety of ways. In one example, the front-end antenna access circuitry 225 includes one or more switches, filters, duplexers, multiplexers, and/or other components. In another example, the front-end antenna access circuitry 225 is omitted in favor of the power amplifier 235 providing the amplified RF signal directly to the antenna 226.

The true power detection system 205 includes a directional coupler 211, a combiner 212, and a power detector 213. The directional coupler 211 provides a first coupled signal and a second coupled signal to the combiner 212. Additionally, the power detector 213 detects an amount of power in the combined signal from the combiner 212 to thereby generate a true power detection signal.

The true power detection signal is provided to the ADC 239, which converts the true power detection signal to a digital format suitable for processing by the baseband processor 221. Implementing the power amplifier system 240 with true power detection can provide a number of advantages. For example, the baseband processor 221 can process the digital true power detection signal to provide power control, to compensate for transmitter impairments, and/or to perform digital pre-distortion (DPD).

The PA supply control circuit 228 receives a power control signal from the baseband processor 221, and controls supply voltages of the power amplifier 235. In the illustrated configuration, the PA supply control circuit 228 generates a first supply voltage $V_{CC1}$ for powering an input stage of the power amplifier 235 and a second supply voltage $V_{CC2}$ for powering an output stage of the power amplifier 235. The PA supply control circuit 228 can control the voltage level of the first supply voltage $V_{CC1}$ and/or the second supply voltage $V_{CC2}$ to enhance the power amplifier system's PAE.

The PA supply control circuit 228 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 228 is a multi-mode supply control circuit that can operate in multiple supply control modes including an APT mode and an ET mode. For example, the power control signal from the baseband processor 221 can instruct the PA supply control circuit 228 to operate in a particular supply control mode.

As shown in FIG. 5, the PA bias control circuit 227 receives a bias control signal from the baseband processor 221, and generates bias control signals for the power amplifier 235. In the illustrated configuration, the bias control circuit 227 generates bias control signals for both an input stage of the power amplifier 235 and an output stage of the power amplifier 235. However, other implementations are possible.

Figure 6:
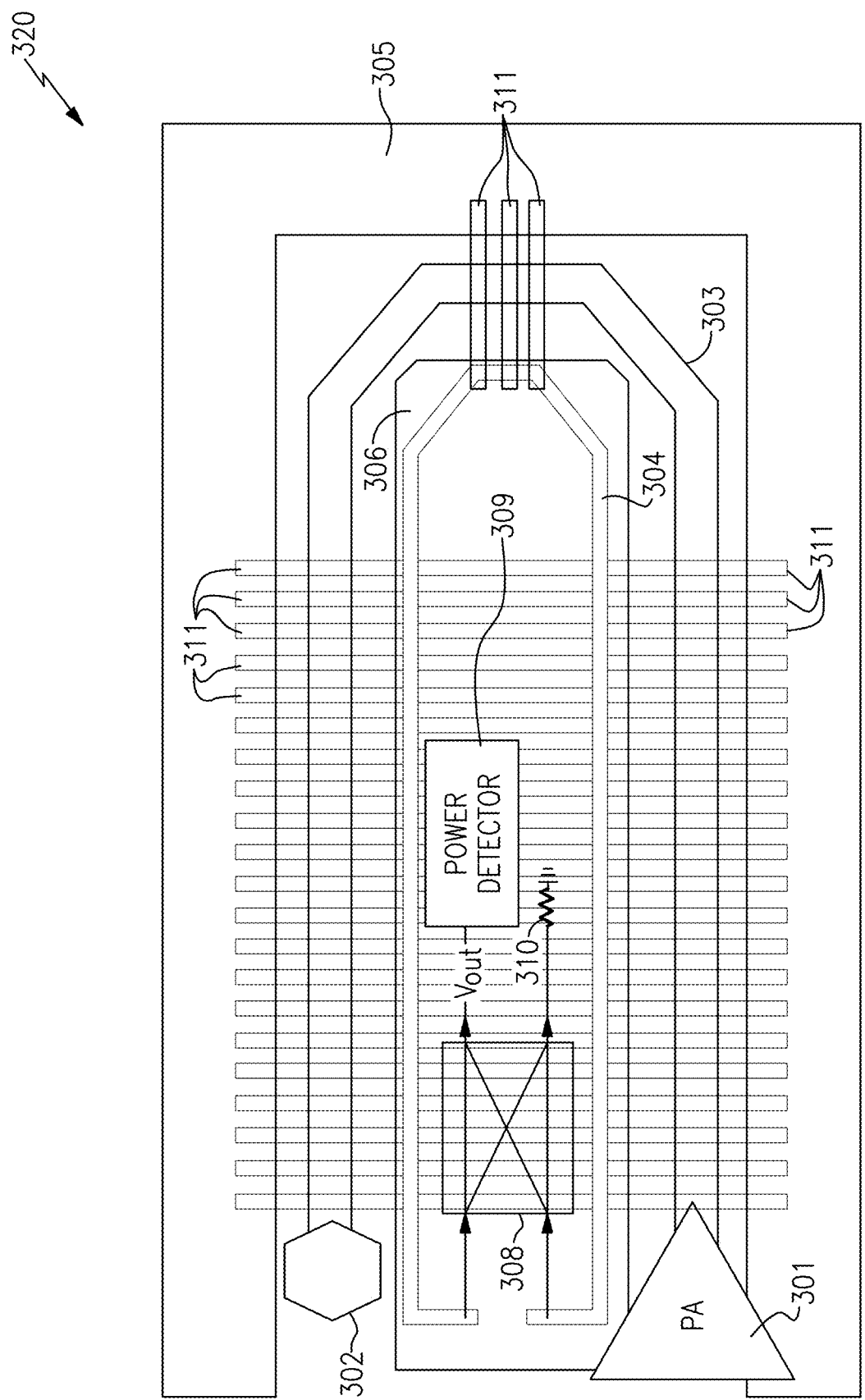
FIG. 6 is a schematic diagram of a power amplifier system according to another embodiment.

FIG. 6 is a schematic diagram of a power amplifier system 320 according to another embodiment. The power amplifier system 320 includes a power amplifier 301, an antenna 302 (implemented as a patch antenna, in this embodiment), a directional coupler, a quadrature hybrid 308, a power detector 309, and a termination impedance 310. In the illustrated embodiment, the directional coupler is implemented as a slow wave coupler including a through line 303, a coupled line 304, a first ground plane 305, a second ground plane 306, and coupling conductors 311.

Although one embodiment of a power amplifier system with true power detection is depicted, the teachings herein are applicable to power amplifier systems implemented in a wide variety of ways. For example, a power amplifier system can include power amplifiers, antennas, directional couplers, combiners, and/or power detectors implemented in other ways. Accordingly, other implementations are possible.

In the illustrated embodiment, the through line 303 is substantially U-shaped, with a first end of the through line 303 connected to an output of the power amplifier 301 and a second end of the through line 303 connected to the antenna 302. Additionally, the coupled line 304 is substantially U-shaped, with a first end of the coupled line 304 connected to a first terminal of the quadrature hybrid 308 and a second end of the coupled line 304 connected to a second terminal of the quadrature hybrid 308. In certain implementations, the first terminal of the quadrature hybrid 308 receives a −3 dB coupled signal at about 0 degrees and the second terminal of the quadrature hybrid 308 receives a −3 dB coupled signal at about −90 degrees. The quadrature hybrid 308 further includes a third terminal that outputs a combined signal ($V_{out}$) and a fourth terminal coupled to the termination resistor 310. The power detector 309 detects a power of the combined signal to generate a true power detection signal.

In the illustrated embodiment, the power amplifier system 320 includes the first ground plane 305 and the second ground plane 306, which are separated from one another by a gap. Additionally, the through line 303 is routed over the gap, and the coupled line 304 is routed over the second ground plane 306. However, other implementations are possible, such as configurations including a common ground plane extending beneath the through line 303 and the coupled line 304.

As shown in FIG. 6, the coupling conductors 311 are included to enhance a coupling factor of the slow wave coupler. For example, in certain implementations the slow wave coupler has a coupling factor of at least 16 dB and/or a directivity of at least 10 dB.

Figure 7A:
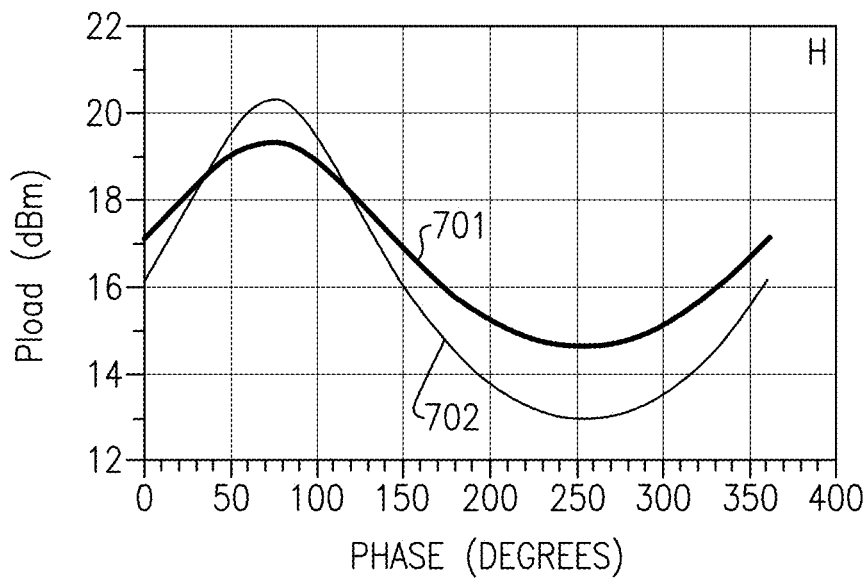
FIG. 7A is a graph of one example of load power versus load phase.

FIG. 7A is a graph of one example of load power versus load phase. The graph includes a first plot 701 for standing wave ratio (SWR) of 2, and a second plot 702 for SWR of 3.

As shown in FIG. 7A, load power varies with load phase and with SWR. Thus, the ratio of reflected to incident power alone cannot be used to detect true power. For example, two different SWRs have the same power delivered to the load at certain load phases.

Figure 7B:
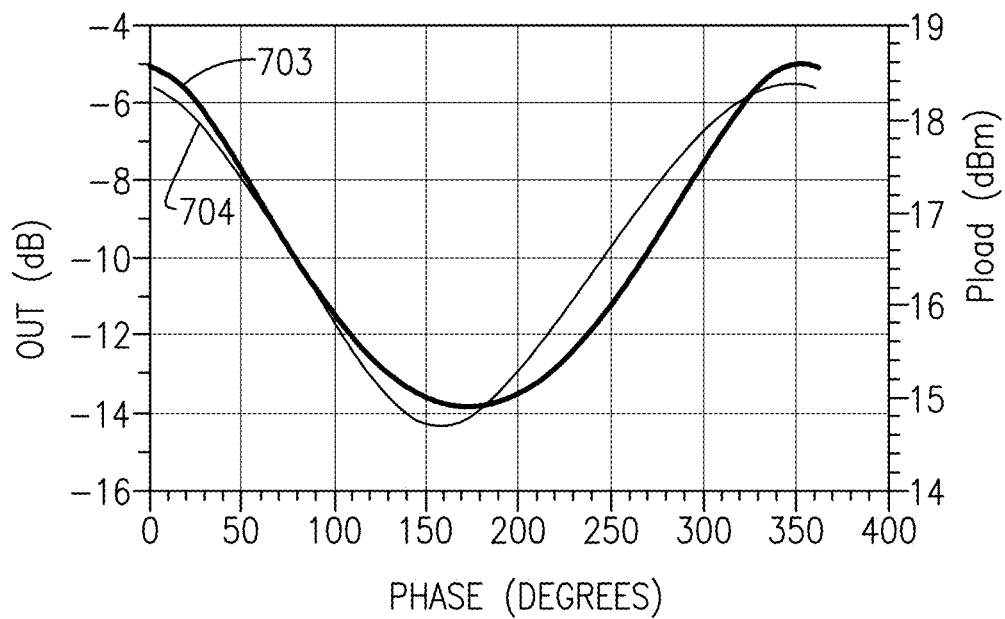
FIG. 7B is a graph of one example of load power and true power detector output versus load phase.

FIG. 7B is a graph of one example of load power and true power detector output versus load phase. The graph includes a first plot 703 of load power in dBm and a second plot 704 of true power detector output in dB.

As shown in FIG. 7B, the true power detector output changes in relation to load power, even as load phase changes. For example, in certain implementations herein a true power detector signal changes in relation to $V_{ref}-j*V_{inc}$, wherein j is the imaginary unit, $V_{ref}$ is the reflected voltage, and $V_{inc}$ is the incident voltage.

Figure 8A:
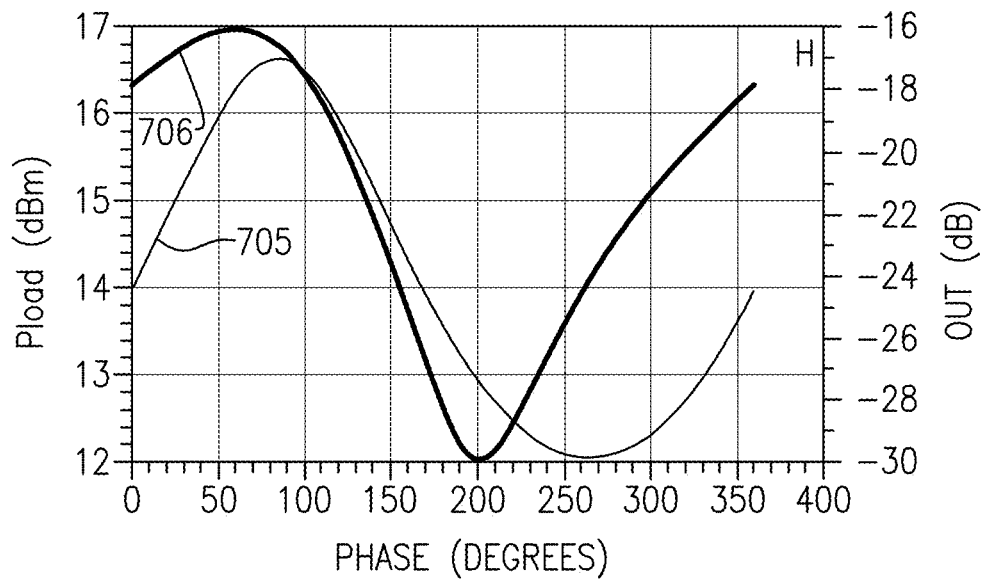
FIG. 8A is a graph of another example of load power and true power detector output versus load phase.

FIG. 8A is a graph of another example of load power and true power detector output versus load phase. The graph includes a first plot 705 of load power in dBm, and a second plot 706 of true power detector output in dB. The graph corresponds to example results for SWR of 2.

Figure 8B:
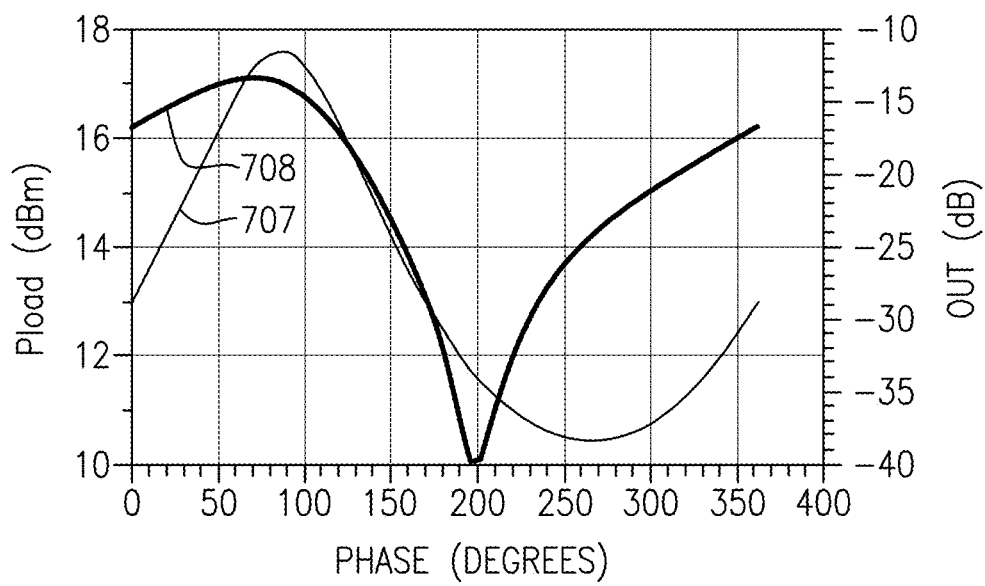
FIG. 8B is a graph of one example of load power and true power detector output versus load phase.

FIG. 8B is a graph of one example of load power and true power detector output versus load phase. The graph includes a first plot 707 of load power in dBm, and a second plot 708 of true power detector output in dB. The graph corresponds to example results for SWR of 3.

Although various example of simulation results are depicted in FIGS. 7A-8B, simulation results can vary based on a wide variety of factors, including, but not limited to, simulation parameters (including operating frequency), antenna models, and/or simulation tools.

Figure 9:
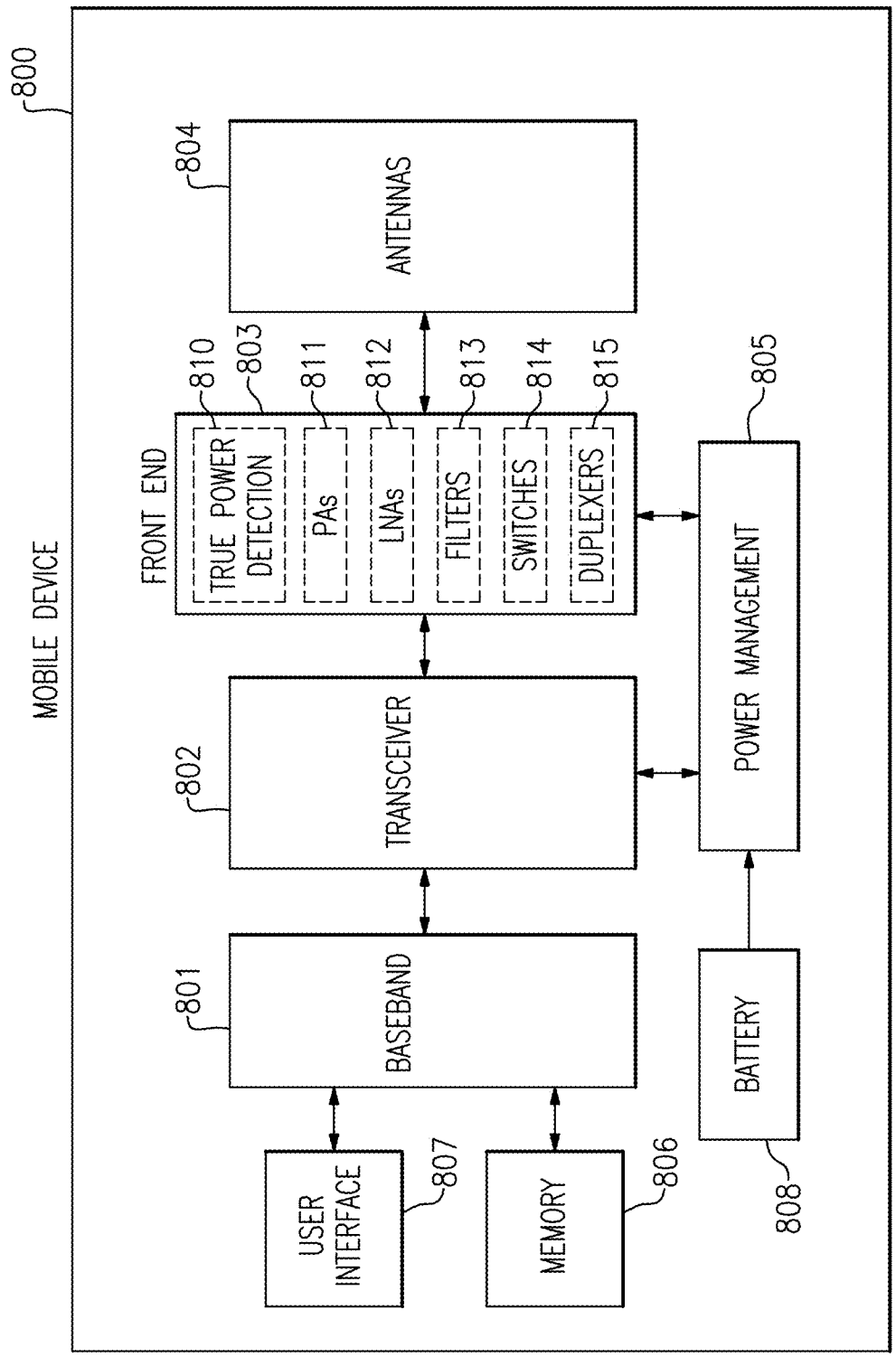
FIG. 9 is a schematic diagram of one embodiment of a mobile device.

FIG. 9 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 9 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes a true power detection system 810, power amplifiers (PAs) 811, low noise amplifiers (LNAs) 812, filters 813, switches 814, and duplexers 815. The true power detection system 810 can be implemented in accordance with any of the embodiments herein.

Although certain components are depicted in the front end system 803, other implementations are possible. For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include phase shifters having variable phase controlled by the transceiver 802. Additionally, the phase shifters are controlled to provide beam formation and directivity for transmission and/or reception of signals using the antennas 804. For example, in the context of signal transmission, the phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (110), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 9, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a power amplifier supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 9, the power management system 805 receives a battery voltage from the battery 808. The battery 808 can be any suitable battery for use in the mobile device 800, including, for example, a lithium-ion battery.

Figure 10A:
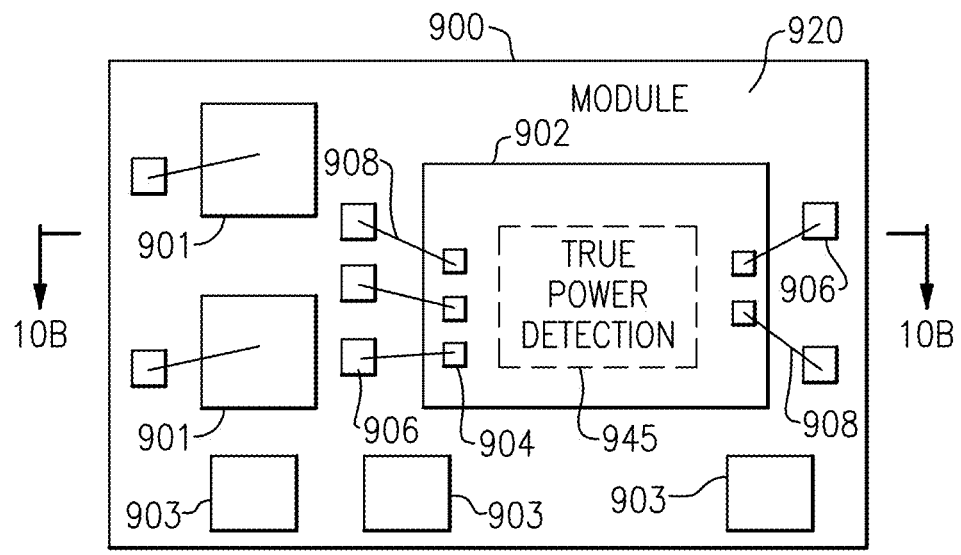
FIG. 10A is a schematic diagram of one embodiment of a packaged module.
Figure 10B:
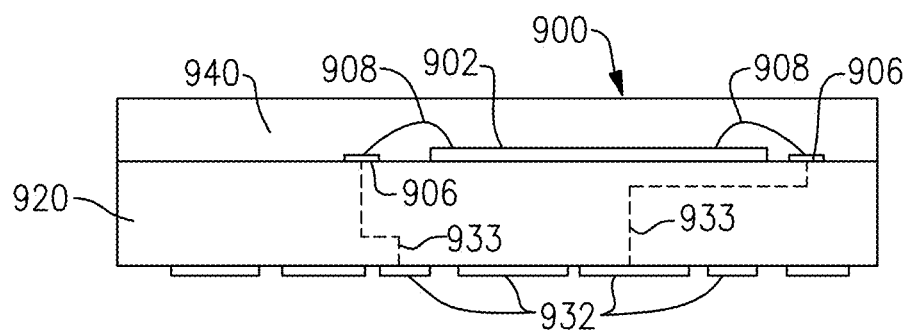
FIG. 10B is a schematic diagram of a cross-section of the packaged module of FIG. 10A taken along the lines 10B-10B.

FIG. 10A is a schematic diagram of one embodiment of a packaged module 900. FIG. 10B is a schematic diagram of a cross-section of the packaged module 900 of FIG. 10A taken along the lines 10B-10B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a true power detection system 945, which can be implemented in accordance with any of the embodiments herein. Thus, the true power detection systems herein can be integrated on-chip, for instance, as a silicon integrated solution. In certain implementations, the semiconductor die 902 includes circuitry in addition to the true power detection system 945. For example, a power amplifier can be included on the semiconductor die 902 on-chip with the true power detection system 945. In another implementation, the power amplifier is included on another semiconductor die that is attached to the packaging substrate 920. Thus, in certain implementations the packaged module 900 includes two or more semiconductor dies.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs). In certain implementations, one or more antennas are included in and/or on the package substrate 900.

As shown in FIG. 10B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 10B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip chip configurations.

Applications

Some of the embodiments described above have provided examples of dynamic antenna array management in connection with wireless communications devices. However, the principles and advantages of the embodiments can be used for any other systems or apparatus that benefit from any of the circuits and systems described herein.

For example, antenna arrays can be included in various electronic devices, including, but not limited to consumer electronic products, parts of the consumer electronic products, electronic test equipment, etc. Example electronic devices include, but are not limited to, a base station, a wireless network access point, a mobile phone (for instance, a smartphone), a tablet, a television, a computer monitor, a computer, a hand-held computer, a personal digital assistant (PDA), a microwave, a refrigerator, an automobile, a stereo system, a disc player, a digital camera, a portable memory chip, a washer, a dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
    a power amplifier configured to receive a radio frequency signal at an input and to output an amplified radio frequency signal at an output;
    an antenna configured to transmit the amplified radio frequency signal;
    a directional coupler having a through line and a coupled line, the through line electrically connected between the output of the power amplifier and the antenna;
    a combiner configured to generated a combined signal based on combining a first coupled signal from a first end of the coupled line and a second coupled signal from a second end of the coupled line; and
    a switch including an input electrically connected to the first end of the coupled line, a first output configured to provide the first coupled signal to the combiner in a first state of the switch, and a second output configured to output a forward power signal in a second state of the switch.

2. The power amplifier system of claim 1 further comprising a power detector configured to generate a power detection signal based on detecting a power of the combined signal.

3. The power amplifier system of claim 2 further comprising an analog-to-digital converter configured to digitize the power detection signal.

4. The power amplifier system of claim 1 wherein the combiner is a quadrature hybrid.

5. The power amplifier system of claim 4 further comprising a termination impedance, the quadrature hybrid including a first terminal electrically connected to the first end of the coupled line, a second terminal electrically connected to the second end of the coupled line, a third terminal configured to output the combined signal, and a fourth terminal electrically connected to the termination impedance.

6. The power amplifier system of claim 1 wherein the through line is U-shaped and the coupled line is U-shaped.

7. A power amplifier system comprising:
    a power amplifier configured to receive a radio frequency signal at an input and to output an amplified radio frequency signal at an output;

an antenna configured to transmit the amplified radio frequency signal;

a directional coupler having a through line that is U-shaped and a coupled line that is U-shaped, the through line electrically connected between the output of the power amplifier and the antenna, the directional coupler further including a plurality of coupling conductors extending beneath the through line and the coupled line; and a combiner configured to generated a combined signal based on combining a first coupled signal from a first end of the coupled line and a second coupled signal from a second end of the coupled line.

8. The power amplifier system of claim 7 further comprising a switch including an input electrically connected to the first end of the coupled line, a first output configured to provide the first coupled signal to the combiner in a first state of the switch, and a second output configured to output a forward power signal in a second state of the switch.

9. The power amplifier system of claim 1 wherein the amplified radio frequency signal is a millimeter wave signal.

10. A method of power detection in a radio frequency communication system, the method comprising:

amplifying a radio frequency signal to generate an amplified radio frequency signal using a power amplifier;

providing the amplified radio frequency signal from an output of the power amplifier to an antenna by way of a through line of a directional coupler; and generating a combined signal based on combining a first coupled signal from a first end of a coupled line of the directional coupler and a second coupled signal from a second end of the coupled line of the directional coupler using a quadrature hybrid that includes a first terminal electrically connected to the first end of the coupled line, a second terminal electrically connected to the second end of the coupled line, a third terminal configured to output the combined signal, and a fourth terminal electrically connected to a termination impedance.

11. The method of claim 10 further comprising generating a power detection signal based on detecting a power of the combined signal.

12. The method of claim 11 further comprising digitizing the power detection signal using an analog-to-digital converter.

13. The method of claim 12 further controlling a transmit power of the radio frequency communication system based on the digitized power detection signal.

14. A mobile device comprising:

a transceiver configured to output a radio frequency signal;

an antenna; and a front end system configured to process the radio frequency signal to generate an amplified radio frequency signal for transmission on the antenna, the front end system including a termination impedance, a power amplifier configured amplify the radio frequency signal and a directional coupler having a through line and a coupled line, the through line electrically connected between an output of the power amplifier and the antenna, the front end system further including a quadrature hybrid configured to generated a combined signal based on combining a first coupled signal from a first end of the coupled line and a second coupled signal from a second end of the coupled line, the quadrature hybrid including a first terminal electrically connected to the first end of the coupled line, a second terminal electrically connected to the second end of the coupled line, a third terminal configured to output the combined signal, and a fourth terminal electrically connected to the termination impedance.

15. The mobile device of claim 14 wherein the front end system further includes a power detector configured to generate a power detection signal based on detecting a power of the combined signal.

16. The mobile device of claim 15 wherein the front end system further includes an analog-to-digital converter configured to digitize the power detection signal.

17. The mobile device of claim 16 further comprising a baseband processor configured to process the digitized power detection signal to control a transmit power of the mobile device.

18. The power amplifier system of claim 7 further comprising a power detector configured to generate a power detection signal based on detecting a power of the combined signal, and an analog-to-digital converter configured to digitize the power detection signal.

19. The power amplifier system of claim 7 wherein the combiner is a quadrature hybrid.

20. The power amplifier system of claim 19 further comprising a termination impedance, the quadrature hybrid including a first terminal electrically connected to the first end of the coupled line, a second terminal electrically connected to the second end of the coupled line, a third terminal configured to output the combined signal, and a fourth terminal electrically connected to the termination impedance.

* * * * *